(12) United States Patent
Kim

(10) Patent No.: US 7,126,853 B2
(45) Date of Patent: Oct. 24, 2006

(54) ELECTRONIC MEMORY HAVING IMPEDANCE-MATCHED SENSING

(75) Inventor: Jongjun Kim, Santa Clara, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 84 days.

(21) Appl. No.: 10/640,929

(22) Filed: Aug. 14, 2003

(65) Prior Publication Data

US 2005/0036389 A1 Feb. 17, 2005

(51) Int. Cl.
  *G11C 16/04* (2006.01)
(52) U.S. Cl. .................... 365/185.11; 365/185.13; 365/185.21; 365/230.03
(58) Field of Classification Search .......... 365/230.03, 365/185.13, 185.21, 230.06, 185.11, 207
See application file for complete search history.

(56) References Cited

U.S. PATENT DOCUMENTS

| | | | |
|---|---|---|---|
| 5,789,297 A | 8/1998 | Wang et al. | 438/267 |
| 6,052,308 A | 4/2000 | Pitts | 365/185.21 |
| 6,339,549 B1 * | 1/2002 | Jinbo et al. | 365/185.13 |
| 6,355,524 B1 | 3/2002 | Tuan et al. | 438/257 |
| 6,562,681 B1 | 5/2003 | Tuan et al. | 438/257 |
| 6,584,018 B1 | 6/2003 | Tuan et al. | 365/185.28 |
| 6,671,203 B1 * | 12/2003 | Tanzawa et al. | 365/185.11 |
| 6,674,669 B1 | 1/2004 | Tuan et al. | 365/185.28 |

* cited by examiner

*Primary Examiner*—David Lam
(74) *Attorney, Agent, or Firm*—Ronald J. Meetin

(57) ABSTRACT

An electronic memory, typically a flash EPROM, contains an array of memory sections (40), each containing an array of memory cells (54). Global bit lines (60) fully traverse the memory. Local bit lines (58) partially traverse the memory. Data stored in the memory is sensed with an arrangement that utilizes impedance matching to achieve high sensing accuracy with low noise sensitivity. The impedance matching may be provided solely from the sections and lines of the memory or partially from a separate reference memory section (102) that contains reference memory cells (104).

48 Claims, 6 Drawing Sheets

ELECTRONIC MEMORY HAVING IMPEDANCE-MATCHED SENSING

FIELD OF USE

This invention relates to semiconductor memories, especially erasable programmable read-only memories ("EPROMs") of the flash-erasable type.

BACKGROUND ART

Semiconductor memories are formed with memory cells that store bits of data. The memory cells are normally very small. As a result, cell data signals that indicate the states of the stored data are electrically small and need to be amplified. Devices commonly referred to as sense amplifiers provide the amplification. A sense amplifier typically amplifies the difference between a data signal received at one input terminal and a reference signal received at another input terminal. Because the cell data signals are small, sense amplifiers must be highly sensitive to correctly read the stored data.

One way to enhance the sensitivity of a sense amplifier is to employ a balanced sensing arrangement that takes advantage of the largely matching impedance characteristics of portions of the circuitry used to access the memory cells. Referring to the drawings, FIG. 1 illustrates a conventional balanced sensing arrangement for a semiconductor memory. The memory circuitry in FIG. 1 consists of memory sections 20 and 22, multiplexers ("MUXes") 24 and 26, and sense amplifiers 28 that provide data output signals.

Each memory section 20 or 22 consists of an array of memory cells 30 accessed through word lines 32 and bit lines 34. Each memory cell 30 is diagramatically shown as being at the intersection of a word line 32 and a bit line 34. When a word line 32 in section 20 is activated, signals indicative of the data in cells 30 along that word line 32 are provided on associated bit lines 34 to MUX 24 which supplies a subset of the data signals on data lines 36 to sense amplifiers 28. A similar activity occurs when a word line 32 in memory section 22 is activated. Signals indicative of the data in cells 30 along that word line 32 are furnished on associated bit lines 34 to MUX 26 which furnishes a subset of those data signals on data lines 38 to amplifiers 28.

A balanced sensing arrangement is achieved by utilizing one memory section 20 or 22 as a reference array when a word line 32 is activated in the other section 22 or 20 for a read operation. During the read operation, none of cells 32 in the reference array are activated. Substantially no current flows through bit lines 34 in the reference array. However, both of MUXes 24 and 26 are activated so that sense amplifiers 28 are connected by way of data lines 36 to a subset of bit lines 34 in section 20 and by way of data lines 38 to a subset of bit lines 34 in section 22.

The subset of bit lines 34 in memory section 22 presents largely the same impedance as the subset of bit lines 34 in memory section 20. Accordingly, the impedance "seen" by sense amplifiers 28 along data lines 38 and the associated subset of bit lines 34 in section 22 largely matches the impedance "seen" by amplifiers 28 along data lines 36 and the associated subset of bit lines 34 in section 20. Matching impedances at the input terminals to sense amplifiers 28 in this way reduces sensitivity to noise, thereby improving the sensing accuracy. Data lines 36 and 38 are, however, commonly quite long, especially when the memory of FIG. 1 is a large memory. The resultant increased impedance is disadvantageous.

Pitts, U.S. Pat. No. 6,052,308, describes an extension of the balanced sensing arrangement of FIG. 1 to a flash EPROM containing a group of memory arrays whose memory cells are formed with floating-gate field-effect transistors ("FETs"). In a floating-gate FET, a floating gate lies between a control gate and the FET's channel region. An n-channel floating-gate FET is programmed by placing electrons on the floating gate to raise the FET's threshold voltage. When the FET is selected for reading by providing an access voltage between the control gate and the FET's source, the access voltage is less than the threshold voltage so that the FET is turned off. This defines a low logic state commonly referred to as logic "0". The FET is erased by removing electrons from the floating gate to reduce the threshold voltage. An access voltage applied between the control electrode and the source is then greater than the threshold voltage. The FET turns on and draws substantial current to establish a high logic state commonly referred to as logic "1".

The floating-gate memory cells utilized in Pitts are of a type subject to an overerasure phenomenon in which the amount of electronic charge removed from a floating gate during erasure is occasionally so great that the cell is turned on even though the cell's word line is not activated. Such an overerased cell draws substantial current. Pitts can eliminate the overerasure by performing a "soft" programming operation on overerased cells. However, if a read operation were performed on one memory section 20 or 22 in FIG. 1 at a time when the other section 22 or 20 contains an overerased cell, i.e., during erasure and/or prior to "soft" programming, the current flowing through the overerased cell could severely damage the sensing accuracy.

Pitts uses an array switching technique to address the overerasure problem. When a memory cell in one of the memory arrays is being read, the EPROM examines a group of associated memory arrays and chooses, as the reference array, an associated array not then undergoing erasure. This is cumbersome because it requires substantial circuitry to perform the array switching. Also, Pitts still needs to perform soft programming whenever overerasure occurs. It would be desirable to have a simple, highly sensitive arrangement for sensing data stored in the cells of a semiconductor memory, especially a flash EPROM of complex architecture.

GENERAL DISCLOSURE OF THE INVENTION

The present invention furnishes such a data sensing arrangement for an electronic memory having global bit lines that fully traverse the memory and local bit lines that only partially traverse the memory. The sensing arrangement of the invention employs impedance matching to achieve highly accurate data sensing with low sensitivity to noise. Selection/connection circuitry appropriately interconnects different memory portions, including the local and global bit lines, to implement the impedance matching in a highly efficient manner. The memory is preferably a flash EPROM whose memory cells are formed with floating-gate FETs of the split-gate type. Consequently, the present memory system is typically not subjected to cell overerasure difficulties and does not require measures, such as soft programming, to overcome overerasure.

The core of the present memory is a group of memory sections functionally arranged in section rows and section columns. Each memory section, sometimes referred to as a sector or block, contains a multiplicity of storage memory cells and a multiplicity of local bit lines. The memory cells are arranged in cell rows and cell columns. The number of cells in each cell column is typically the same across the memory. Each local bit line is connected to the cells in a different one of the cell columns. When the present memory is implemented as a flash EPROM, all the cells of each memory section are typically erased simultaneously and separately from all the cells in each other memory section.

The present memory is provided with multiple global bit lines, multiple data lines, a sense amplifier, and a reference current source. The global bit lines are allocated into global bit line sets respectively corresponding to the memory section columns. Each global bit line in each global bit line set is associated with a different plurality of the local bit lines in each of the memory sections of the corresponding section column. The data lines respectively correspond to the section columns such that each data line is associated with the global bit lines for the corresponding section column. The sense amplifier has a data input terminal, a reference input terminal, and an output terminal for providing an output signal indicative of a comparison between the signals at the input terminals. The reference current source provides a reference current to the amplifier's reference input terminal.

The memory of the invention contains further circuitry, to be described momentarily, that implements the impedance matching. An understanding of the further circuitry is facilitated by first looking at how the circuitry is to implement impedance matching when the sense amplifier is sensing data contained in a memory cell in one of the memory sections. This memory cell is connected through its local bit line, through the global bit line for that local bit line, and through the data line for the global bit line to the data input terminal of the amplifier. To achieve impedance matching, the reference input terminal needs to be connected to reference circuitry, including one or more reference lines, having largely the same impedance characteristics as the data line, the global bit line, and the local bit line that connect the amplifier's data input terminal to the cell.

In one embodiment of the present memory, the impedance-matching reference circuitry consists of lines that connect the reference input terminal of the sense amplifier to memory cells in a memory section, referred to as the reference memory section, in a different section row and a different section column than the memory section for the cell being read. The reference circuitry is formed with a data line, a global bit line, and a local bit line that connect the amplifier's reference input terminal to memory cells in the reference memory section.

The reference circuitry in the first embodiment is achieved by providing the memory system with suitable selection/connection circuitry. In addition to having the capability for selecting each local bit line, the selection/connection circuitry is operable (a) to connect each selected local bit line in each memory section of each section row and section column to the amplifier's data input terminal by way of (a1) the global bit line for the selected local bit line and (a2) the data line for that global bit line and (b) to largely simultaneously connect a reference one of the local bit lines in a reference one of the memory sections in another section row and another section column to the amplifier's reference input terminal by way of (b1) the global bit line, termed the reference global bit line, for the reference local bit line and (b2) the data line for the reference global bit line.

By operating the memory so that none of the memory cells along the local bit lines associated with the reference global bit line is selected, the sense amplifier reads a selected one of the cells along the selected local bit line. Due to the architecture of the memory, the reference local bit line, the reference global bit line, and the data line connected to the reference global bit line respectively have largely the same impedance characteristics as the local bit line, the global bit line, and the data line for the cell being read. Impedance matching thereby occurs at the input terminals of the sense amplifier to produce highly accurate data sensing.

The present memory system is provided with a separate reference memory section in a second embodiment. The reference memory section contains a reference bit line and a column of reference memory cells. The reference bit line is connected to the reference cells and to the reference input terminal of the sense amplifier. In the second embodiment, the impedance-matching reference circuitry is formed with the reference bit line, a global bit line for a section column different from the one that includes the memory section for the cell being read, and a data line which connects that global bit line to the amplifier's reference input terminal.

The reference circuitry is achieved by providing the memory with selection/connection circuitry that, in addition to having the capability for selecting each local bit line, is operable (a) to electrically connect each selected local bit line in each memory section of each of the section columns to the sense amplifier's data input terminal by way of (a1) the global bit line for the selected local bit line and (a2) the data line for the selected local bit line and (b) to largely simultaneously electrically connect a reference one of the global bit lines for another of the section columns to the amplifier's reference input terminal by way of the data line for the reference global bit line. By again operating the memory so that none of the cells along the local bit lines associated with the reference global bit line is selected, the sense amplifier reads a selected cell along the selected local bit line. Appropriately configuring the reference bit line, including arranging for the number of reference memory cells to be the same as the number of memory cells in each cell column of each memory section, enables the reference bit line, the reference global bit line, and the data line connected to the reference global bit line to respectively have largely the same impedance characteristics as the local bit line, the global bit line, and the data line for the cell being read. The resultant impedance matching at the amplifier's input terminals produces accurate data sensing.

A memory provided with impedance matching according to the invention typically includes a group of sense amplifiers, one for each bit of a word stored in the memory. For example, an implementation of the present memory may have sixteen sense amplifiers for reading a 16-bit word. In that case, the circuit connections and the circuit functions for the sense amplifier described above are basically repeated for each other sense amplifier.

The designation of one global bit line as a reference global bit line for another global bit line is typically done in advance. In contrast to what occurs in Pitts, the memory system of the invention typically does not require circuitry for switching the reference global bit lines for each so-selected global bit line. Similar comments apply to the local bit lines that serve as reference local bit lines for each local bit line in the first embodiment of the present memory system. The impedance-matched sensing circuitry of the present invention is thus less cumbersome than that of Pitts. In short, the present invention provides a substantial advance over the prior art.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

In the following description, elements that fall into sequences or are grouped into two-dimensional arrays are generally collectively identified by reference symbols without subscripts. An element's position in a sequence or two-dimensional array is indicated by using the collective reference symbol for the element followed by a subscript position indicator. Each of subscripts "i", "j", and "k" is a running integer for an arbitrary position in a sequence or two-dimensional array. Symbols "M", "N", "P", "Q", "R", "S", and "T" are fixed integers.

As used below, "connection" means an electrical connection except as otherwise indicated. Similarly, "line" means an electrical line or conductor. All FETs described below are n-channel insulated-gate FETs except as otherwise indicated.

Figure 1:
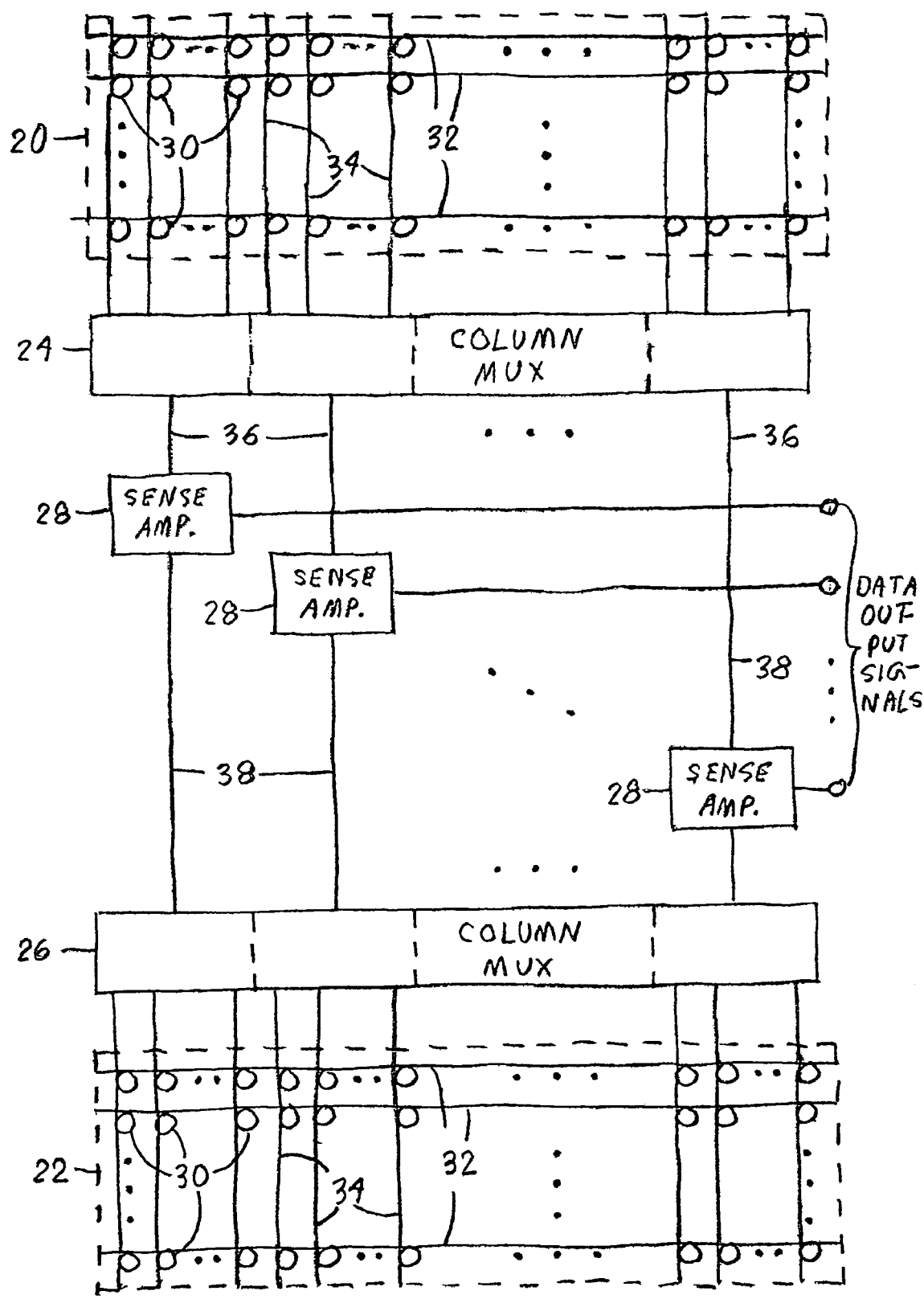
FIG. 1 is a block/circuit diagram of a conventional memory having balanced data sensing.
Figure 2:
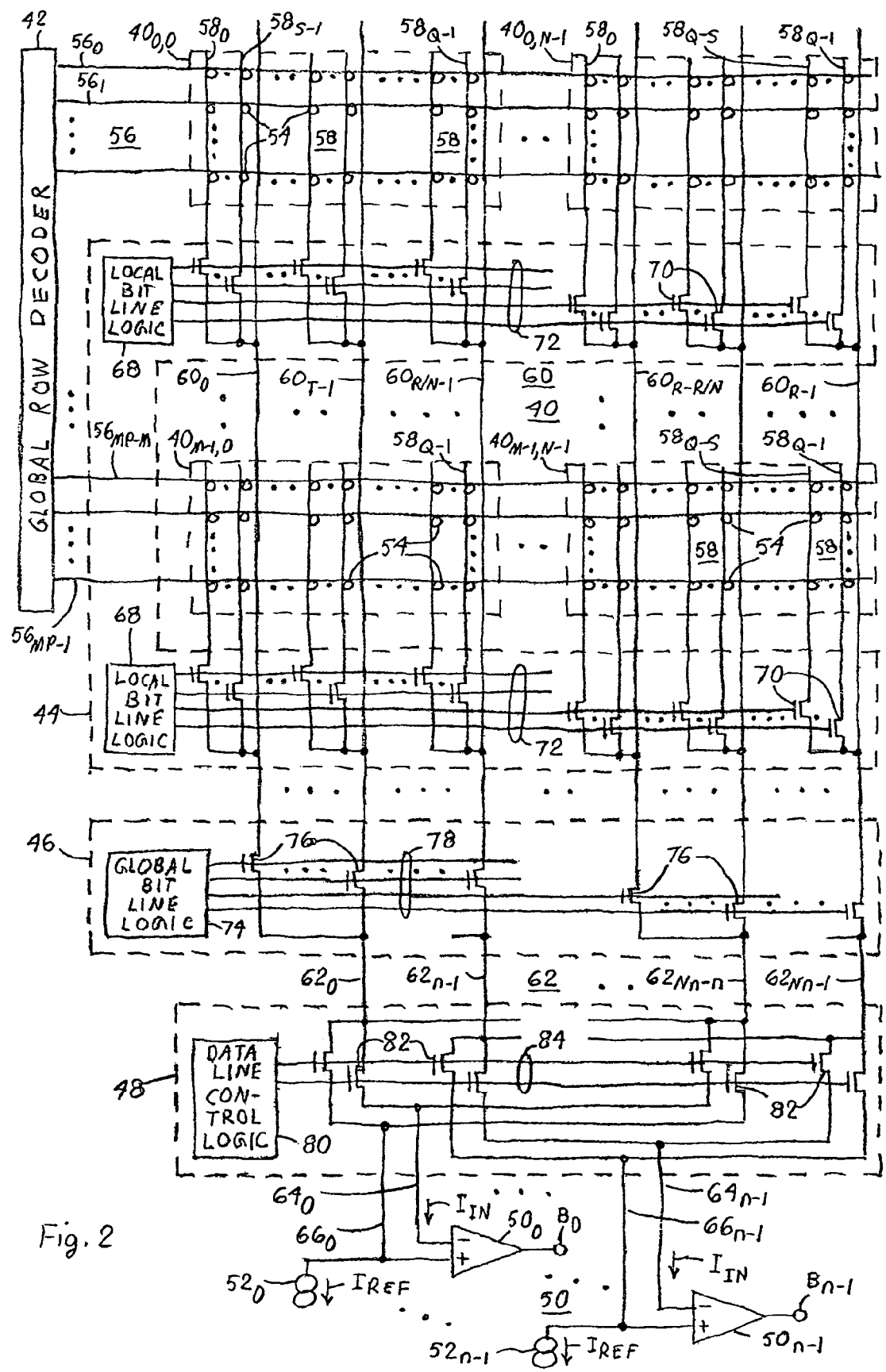
FIG. 2 is a block/circuit diagram of a memory having impedance-matched data sensing in accordance with invention.

FIG. 2 illustrates a memory configured according to the invention for achieving impedance-matched data sensing. The memory of FIG. 2 contains a group of largely identical local storage memory sections 40, a global row decoder 42, a local column decoder 44, a global column decoder 46, data line control circuitry 48, n largely identical sense amplifiers 50, and n largely identical reference current sources 52 respectively corresponding to sense amplifiers 50. Integer n is the number, e.g., 16, of bits contained in words stored in the memory.

Local memory sections 40 are functionally arranged in an array of M section rows and N section columns. Memory sections 40 are numbered $40_{i,j}$ in FIG. 2 where section row number i runs from 0 to M−1, and section column number j runs from 0 to N−1. Each section 40 contains a multiplicity of storage memory cells 54 functionally arranged in an array of P cell rows and Q cell columns. Since sections 40 are largely identical, cell row size P and cell column size Q are respectively constant across the array of sections 40. Likewise, cells 54 are largely identical.

Figure 6:
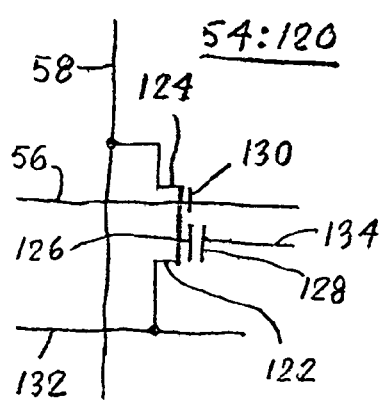
FIG. 6 is a block/circuit diagram of a memory cell employable in the memory of each of FIGS. 2–5.

Memory cells 54 are accessed through global word lines 56 and local bit lines 58. Each cell 54 is specifically accessed through one global word line 56 and one local bit line 58 and, for illustration simplicity, is shown as being at the intersection of those two lines 56 and 58. FIG. 6, dealt with below, presents further information on how each cell 54 is connected to its word line 56 and its local bit line 58.

Word lines 56 extend fully across the array. Each word line 56 is associated with one memory section row, i.e., row of memory sections 40, and is connected to all of memory cells 54 in one of the cell rows in each section 40 of the associated section row. Consequently, there are MP word lines 56. In FIG. 2, word lines 56 are numbered $56_i$ where global row number i runs from 0 to MP−1.

Responsive to suitable address signals, global row decoder 42 provides row access signals on word lines 56 for selectively accessing memory cells 54 in order to perform read and write operations on cells 54. More particularly, the row access signals normally cause cells 54 along only a selected one of word lines 56 to be activated at a time. Since word lines 56 pass fully through the array of memory sections 40, cells 54 in one row of each of sections 40 along a memory section row are accessed together. Normally only part of cells 54 in a selected one of sections 40 in a section row are actually subjected to a read or write operation at a time. This column selection is achieved with column decoders 44 and 46 and data line control circuitry 48 as discussed below.

Local bit lines 58 extend only partially across the array of memory sections 40. In particular, local bit lines 58 are divided into MN groups of Q lines 58. Each group of Q local bit lines 58 extends fully across memory cells 54 in one of sections 40 but does not extend across cells 54 in any other section 40. Accordingly, each group of Q lines 58 is local to one section 40 and essentially forms part of that section 40. Each local bit line 58 is connected to all of cells 54 in a corresponding different one of the cell columns in that local bit line's section 40. For each section 40, local bit lines 58 are numbered $58_j$ in FIG. 2 where local bit line number j runs from 0 to Q−1.

Responsive to suitable address signals, local column decoder 44 selectively connects local bit lines 58 to R global bit lines 60 that extend fully across the array of memory sections 40. Global bit lines 60 are numbered $60_j$ in FIG. 2 where global bit line number j runs from 0 to R−1. Global bit lines 60 are allocated into N global bit line sets respectively corresponding to the memory section columns. Each global bit line set consists of R/N lines 60. For example, the global bit line set corresponding to the first memory section column (left-most in FIG. 2) is formed with R/N lines $60_0$–$60_{R/N−1}$.

Each line 60 in each global bit line set is associated with a different plurality of S consecutive local bit lines 50 in each memory section 40 of the corresponding memory section column. For instance, global bit line $60_j$ is associated with local bit lines $58_0$–$58_{S−1}$ in each of sections 40 of the corresponding section column. Since there N section columns, each global bit line 60 is associated with N different pluralities of S local bit lines 58. S equals NQ/R.

Local column decoder 44 selectively connects each global bit line 60 to the associated N pluralities of S local bit lines 58 but not to any other local bit line 58. More particularly, decoder 44 normally connects each global bit line 60 to no more than one local bit line 58 in the N associated pluralities of S local bit lines 58 in memory sections 40 of the corresponding memory section column at a time.

Global column decoder 46 selectively connects global bit lines 60 to Nn data lines 62 in response to suitable address signals where, as indicated above, n is the number of sense amplifiers 50. In FIG. 2, data lines 62 are numbered $62_j$ where data line number j runs from 0 to Nn−1. Each data line 62 is associated with a different plurality of T consecutive global bit lines 60 where T equals R/Nn because there are R lines 60. For example, data line $62_0$ is associated with global bit lines $60_0$–$60_{T-1}$. Decoder 46 selectively connects each data line 62 to the associated plurality of T global bit lines 60 but not to any other global bit line 60. More particularly, decoder 46 normally connects each data line 62 to no more than one of the associated plurality of T global bit lines 60 at a time.

Data lines 62 are allocated into n data line groups respectively corresponding to the n sense amplifiers 50. Each data line group thereby contains N lines 62. Lines 62 in each data line group respectively correspond to the memory section columns. That is, one line 62 in each data line group corresponds to each different section column. For example, the first data line group consists of the N lines $62_0$, $62_n$, $62_{2n}$, ... $62_{Nn-n}$. The last data line group is formed with the N lines $62_{n-1}$, $62_{2n-1}$, $62_{3n-1}$, ... $62_{Nn-1}$. In other words, the members of each data line group consists of every nth line $62_j$.

Each of sense amplifiers 50 has a data input terminal (−), a reference input terminal (+), and a data output terminal. Each amplifier 50 amplifies the difference between the currents at its input terminals to provide its output terminal with an amplified data output signal B indicative of a comparison between the currents at the input terminals. The data input terminal of each amplifier 50 is connected to a corresponding different one of n amplifier data input lines 64. The reference input terminal of each amplifier 50 is similarly connected to a corresponding different one of n amplifier reference input lines 66. Amplifiers 50 are number $50_k$ in FIG. 2 where sense amplifier number k, i.e., the data bit number, runs from 0 to n−1.

Data line control circuitry 48 selectively connects data input line 64 extending from each sense amplifier 50 to one or more, but not all, of data lines 62 in the corresponding data line group. Control circuitry 48 simultaneously connects reference input line 66 extending from that amplifier 50 to another one or more, but not all, of lines 62 in the corresponding data line group. None of data lines 62 connected to a data input line 66 at any time is simultaneously connected to corresponding reference input line 64, and vice versa.

To the extent that any amplifier input line 64 or 66 is connected to more than one data line 62 at a time, global column decoder 46 nulls the effect of each connection in excess of one. As a result, the two input terminals of each sense amplifier 50 are respectively effectively connected to only two different lines 62 of the corresponding data line group at a time. In light of how column decoders 44 and 46 are controlled, these connections enable the impedance seen at the reference input terminal of each amplifier 50 to largely match the impedance seen at the data input terminal of that amplifier 50.

Figure 7:
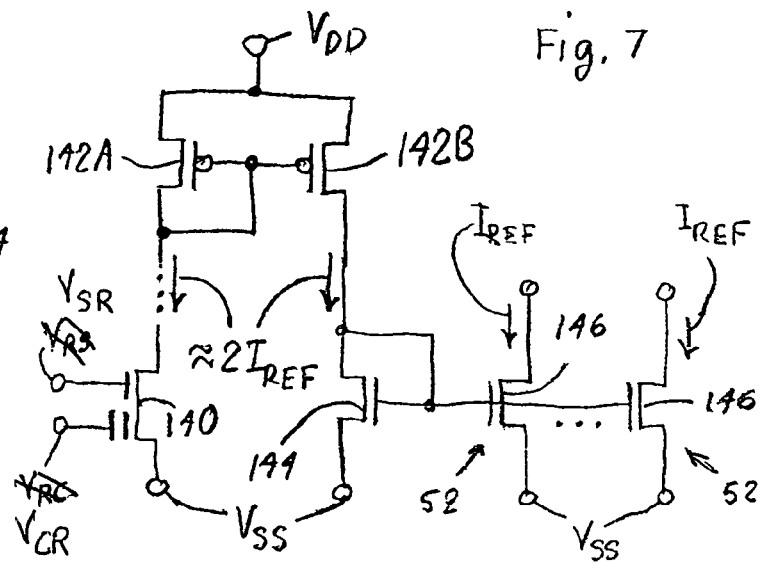
FIG. 7 is a circuit diagram of a group of reference current sources employable in the memory of each of FIGS. 2–5.

Reference current sources 52 are respectively connected through reference input lines 66 to the reference input terminals of sense amplifiers 50. Similar to amplifiers 50, current sources 52 are numbered $52_k$ in FIG. 2 where data bit number k again runs from 0 to n−1. Circuitry suitable for implementing each current source 52 is illustrated in FIG. 7 and described below.

Each current source 52 provides a reference current $I_{REF}$ that is supplied to the reference input terminal of corresponding sense amplifier 50 via corresponding reference input line 66. Reference currents $I_{REF}$ are largely equal. Each current $I_{REF}$ is approximately 50% of the current flowing through a memory cell 54 when it is fully conductive. More particularly, each current $I_{REF}$ is normally 30–70% of the current flowing through a fully conductive one of cells 54. Column decoders 44 and 46 and data line control circuitry 48 are controlled so that substantially no current is provided to the reference input terminal of each amplifier 50 by way of a path going through lines 62, 60, and 58 to any of cells 54. Accordingly, the current at the reference input terminal of each amplifier 50 is normally substantially $I_{REF}$.

The data input terminal of each sense amplifier 50 receives an input current $I_{IN}$. When a memory cell is turned off, it draws essentially zero current and is typically considered to be in a low logic, or "0", state. A cell 54 which is turned on and draws substantially the full memory cell current is, in a complementary manner, typically considered to be in a high logic, or "1", state. Due to the connections which column decoders 44 and 46 and data line control circuitry 48 provide for sense amplifiers 50 by way of lines 58, 60, 62, and 64, current $I_{IN}$ at the data input terminal of each sense amplifier 50 is normally either substantially zero or substantially the full memory cell current when that amplifier 50 is reading an associated one of cells 54. If input current $I_{IN}$ to each amplifier 50 sufficiently exceeds reference current $I_{REF}$, that amplifier 50 generates its output signal B at a value indicating that cell 54 being read contains a "1", and vice versa.

With the foregoing in mind, let each memory section 40 be referred to as "selected" when a read operation is to be performed on certain memory cells 54 in that section 40. The basic principle for achieving impedance-matched sensing in the memory of FIG. 2 is to provide each section 40, when it is selected, with a predesignated reference one of sections 40 in a different memory section row and a different memory section column than selected section 40. For example, section $40_{M-1,N-1}$ could be the reference memory section for section $40_{0,0}$, and vice versa. Similarly, section $40_{M-1,0}$ could be the reference memory section for section $40_{0,N-1}$, and vice versa.

In reading n memory cells 54 along a selected word line 56 in a selected memory section 40, column decoders 44 and 46 and control circuitry 48 selectively connect the data input terminal of a sense amplifier 50 to a different one of those n cells 54 by way of (a) local bit line 58, referred to as the selected local bit line, for that cell 54, (b) global bit line 60, referred to as the selected global bit line, for selected bit line 58, (c) data line 62, referred to as the selected data line, for selected global bit line 60, and (d) data input line 64 for that amplifier 50. The data input terminal of each amplifier 50 thereby sees an input impedance along a composite data line formed with selected local bit line 58, selected global bit line 60, selected data line 62, and associated data input line 64.

Column decoders 44 and 46 and control circuitry 48 are configured and operable to simultaneously connect the reference input terminal of each sense amplifier 50 to a predesignated reference local bit line 58 in reference memory section 40 by way of (a) global bit line 60, referred to as the global bit line, for reference local bit line 58, (b) data line 62, referred to as the reference data line, for reference global bit line 60, and (c) reference input line 66 for that amplifier 50. Consequently, the reference input terminal of each amplifier 50 sees a reference impedance along a composite reference line formed with reference local bit line 58, reference global bit line 60, reference data line 62, and associated reference input line 66. These four lines respectively have largely the same impedance characteristics as selected local bit line 58, selected global bit line 60, selected data line 62, and associated data input line 64 of the composite data line for that amplifier 50. The input terminals of each amplifier 50 thereby see largely equal impedances.

By arranging for each memory section 40 and its reference section 40 to be in different memory section rows, none of cells 54 in reference section 40 is accessed when selected section 40 is undergoing a read operation. Hence, substantially no current flows through the composite references lines to interfere with the data sensing by sense amplifiers 50. Arranging for each section 40 and its reference section 40 to be in different section columns simplifies the configuration and operation of column decoders 44 and 46 and control circuitry 48.

Local column decoder 44 contains local bit line logic 68 and MNQ local column switching FETs 70. Each FET 70 is physically source-drain connected between one of global bit lines 60 and a corresponding different one of associated NS local bit lines 58, i.e., the N pluralities of S lines 58 associated with that global bit line 60. Local bit line logic 68 is connected by way of local column control lines 72 to the gate electrodes of FETs 70 for controlling their switching.

Responsive to suitable row and column address signals, local bit line logic 68 provides control lines 72 with local column control signals that cause certain of FETs 70 to turn on and connect R/N predesignated local bit lines 58 in selected memory section 40 respectively to their global bit lines 60. The local column control signals also cause certain others of FETs 70 to turn on and connect R/N other predesignated local bit lines 58 in reference section 40 respectively to their global bit lines 60. Each so-connected global bit line 60 is connected to one of the associated plurality of S local bit lines 58, thereby partially implementing the column selection within selected and reference sections 40.

The local column control signals provided by control logic 68 normally cause certain further ones of FETs 70 to turn on and simultaneously connect further predesignated local bit lines 58 in yet other memory sections 40 respectively to global bit lines 60 for those lines 58. These other sections 40 are typical in the same two section rows as selected and reference sections 40. For example, R/N predesignated local bit lines 58 are typically respectively connected to their global bit lines 60 in each of (a) half of sections 40, including selected section 40, along the section row for selected section 40 and (b) half of sections 40, including reference section 40, along the section row for reference section 40. Global column decoder 46 nulls any effect that these further connections might have on the data sensing.

Global column decoder 46 contains global bit line logic 74 and R global column switching FETs 76. Each FET 76 is physically source-drain connected between one of data lines 62 and one of the associated T global bit lines 60. Logic 74 is connected by global control lines 78 to the gate electrodes of FETs 76 for controlling their switching.

Decoder 46 performs a selection on global bit lines 60 to accomplish two functions: (a) connect certain of lines 60 that pass through selected and reference memory sections 40 to data lines 62 and (b) null the excess connections, if any, that local column decoder 44 makes between local bit lines 58 and certain of global bit lines 60. Responsive to suitable column address signals, global bit line logic 74 provides control lines 78 with global column control signals that cause certain of FETs 76 to turn on and connect n of global bit lines 60 that pass through selected section 40 respectively to their data lines 62. The global column control signals also cause certain others of FETs 76 to turn on and connect n of global bit lines 60 that pass through reference section 40 respectively to their data lines 62. Each so-connected data line 62 is connected to one of the associated plurality of T global bit lines 60.

FIG. 2 illustrates global column decoder 46 in a general manner. If any one of certain memory sections 40, e.g., section $40_{M-1,N-1}$, were the reference section for the diagonally opposite memory section, i.e., section $40_{0,0}$ in this example, the global column control signals for FETs 76 connected to global bit lines 60 that pass through the first memory section column would also respectively be the global bit line control signals for FETs 76 connected to lines 60 that pass through the last section column.

The excess connections that local column decoder 44 makes between certain of global bit lines 60 and local bit lines 58 are nulled in global column decoder 46 by providing certain of the global column control signals at values that cause FETs 76 connected to those global bit lines 60 to be turned off, thereby preventing any of those lines 60 from being connected to any of data lines 62. The control operations provided by column decoders 44 and 46 in combination with the selection of a word line 56 by row decoder 42 establishes which memory section 40 is selected for reading and which section 40 is the associated reference memory section. Accordingly, n selected bit lines 58 in selected section 40 are respectively connected through their global bit lines 60 to n data lines 62, and n selected local bit lines 58 in reference section 40 are respectively connected through their global bit lines 60 to n other data lines 62.

N, the number of memory section columns, is typically at least 4. In that case, certain groups of data lines 62 are normally connected together within data line control circuitry 48 to form composite data lines. More particularly, data lines 62 are divided into groups consisting of every nth line 62. One such group consists of lines $62_0$, $62_n$, ... $62_{Nn-2n}$, and $62_{Nn-n}$. Half, e.g., the lower half, of lines 62 in each such group are typically connected together to form one composite data line. The remaining half, i.e., the upper half in this example, of lines 62 in that group are likewise typically connected together to form another composite data line.

Control circuitry 48 contains data line control logic 80 and data line switching FETs 82. One half of FETs 82 are respectively physically drain-source connected between the composite data lines, on one hand, and data input lines 64 to the data input terminals of sense amplifiers 50, on the other hand. The remaining half of FETs 82 are similarly respectively physically drain-source connected between the composite data lines, on one hand, and reference input lines 66 to the reference input terminals of amplifiers 50, on the other hand. Logic 80 is connected by way of data control lines 84 to the gate electrodes of FETs 82 for controlling their switching.

Responsive to suitable column address signals, data line control logic 80 provides control lines 84 with data control signals that cause certain of FETs 82 to turn on and respectively connect data input lines 64 to n composite data lines that are respectively connected to n selected local bit lines 58 in selected memory section 40 by way of (a) global bit lines 60 for those local bit lines 58 and (b) data lines 62 for those global bit lines 60. The data control signals also cause certain others of FETs 82 to turn on and respectively connect reference input lines 66 to n composite data lines that are respectively connected to n reference local bit lines 58 in reference section 40 by way of (a) associated reference global bit lines 60 and (b) data lines 62 for those reference global bit lines 60. Consequently, the connections needed for impedance-matched sensing are achieved.

Figure 3:
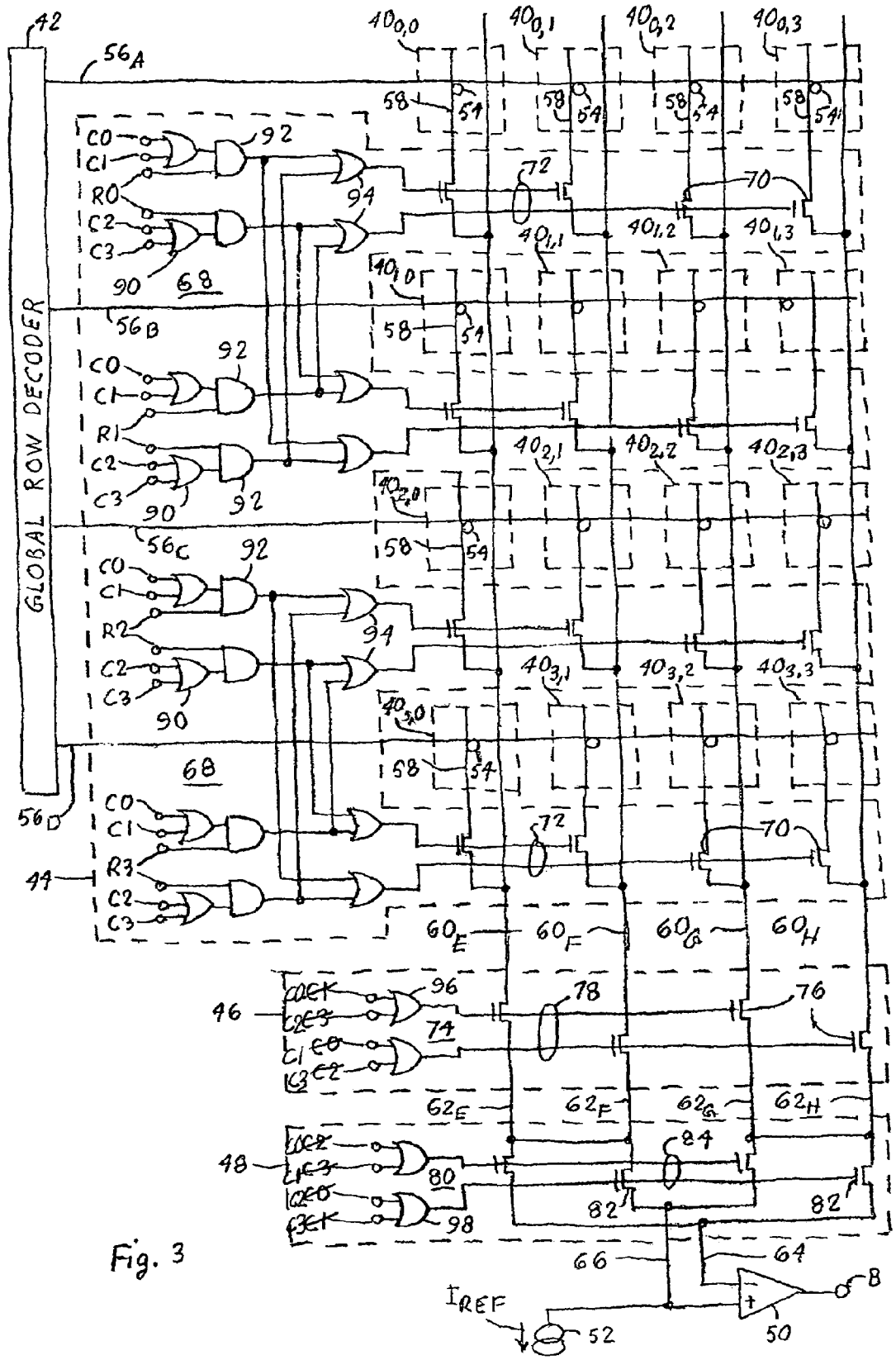
FIG. 3 is a block/circuit diagram of an implementation of part of the memory of FIG. 2.

A further understanding of the memory of FIG. 2 can be achieved by examining FIG. 3 which illustrates a partial implementation of the memory of FIG. 2. The number M of memory section rows and the number N of memory section columns are both 4 in FIG. 3. Consequently, the implementation of FIG. 3 contains sixteen local memory sections 40 ranging from memory section $40_{0,0}$ to memory section $40_{3,3}$.

Several simplifications have been made in FIG. 3 to facilitate explaining the memory system operation. Firstly, FIG. 3 only depicts one sense amplifier 50 and the associated circuit portions. Secondly, each memory section 40 in FIG. 3 is provided with only one memory cell 54, one associated word line 56, and one associated local bit line 58. Since there are four memory section rows, four word lines 56 are shown in FIG. 3. These lines 56 are respectively labeled $56_A$, $56_B$, $56_C$, and $56_D$ going from the first section row to the last section row.

Thirdly, only one global bit line 60 is provided for each memory section column in FIG. 3. Inasmuch as there are four section columns in FIG. 3, four global bit lines 60 are shown in FIG. 3. These lines 60 are respectively labeled $60_E$, $60_F$, $60_G$, and $60_H$ going from the first section column to the last section column. Four illustrated data lines 62 are similarly respectively labeled $62_E$, $62_F$, $62_G$, and $62_H$.

Logic 68 in local column decoder 44 consists of a first level of OR logic gates 90, a level of AND logic gates 92, and a second level of OR logic gates 94. Logic 74 in global column decoder 46 consists of OR logic gates 96. Logic 80 in control circuitry 48 similarly consists of OR logic gates 98. Each of OR gates 90, 94, 96, and 98 is typically implemented as a NOR logic gate with an output inverter. Each AND gate 92 is similarly typically implemented as a NAND logic gate with an output inverter.

Row address signals R0, R1, R2, and R3 and column address signals C0, C1, C2, and C3 are variously provided to logic gates 90, 92, 94, 96, and 98. Row address signals R0–R3 respectively identify the four memory section rows. Column address signals C0–C3 similarly respectively identify the four memory section columns. In an implementation where each memory section 40 has multiple columns (and rows) of memory cells, logics 68 and 74 are provided with additional logic and with additional column control signals to select among the multiple columns in each section 40.

A memory section 40 is selected for a read operation by placing the row and column address signals for its section row and section column at logic "1" while the remaining ones of address signals R0–R3 and C0–C3 are placed at logic "0". An examination of logic 68 in local column decoder 44 of FIG. 3 shows that adjusting address signals R0–R3 and C0–C3 in this way causes four of FETs 70 to turn on. One of conducting FETs 70 connects one global bit line 60 to the memory section 40 intended to be selected. Another of conducting FETs 70 connects another line 60 to a section 40 in the same section row as selected section 40. The remaining two conducting FETs 70 connect two remaining lines 60 respectively to two sections 40 in a section row not having selected section 40.

A similar examination of logic 74 in global column decoder 46 of FIG. 3 shows that two of FETs 76 are turned on. One of conducting FETs 76 connects one data line 62 to global bit line 60 connected to local bit line 58 in selected memory section 40. The other conducting FET 76 connects another data line 62 to global bit line 60 connected to local bit line 58 in section 40 of a different section row than selected section 40. This establishes that other section 40 as the reference memory section. The remaining two FETs 78 are off. The connections that local column decoder 44 provides from the other two sections 40 are nulled. The net result is that column decoders 44 and 46 together cause one reference section 40 to be established for selected section 40.

The following table identifies the reference memory section for each selected memory section in the implementation of FIG. 3:

| Selected Memory Section | Reference Memory Section |
| --- | --- |
| $40_{0,0}$ | $40_{1,2}$ |
| $40_{0,1}$ | $40_{1,3}$ |
| $40_{0,2}$ | $40_{1,0}$ |
| $40_{0,3}$ | $40_{1,1}$ |
| $40_{1,0}$ | $40_{0,2}$ |
| $40_{1,1}$ | $40_{0,3}$ |
| $40_{1,2}$ | $40_{0,0}$ |
| $40_{1,3}$ | $40_{0,1}$ |
| $40_{2,0}$ | $40_{3,2}$ |
| $40_{2,1}$ | $40_{3,3}$ |
| $40_{2,2}$ | $40_{3,0}$ |
| $40_{2,3}$ | $40_{3,1}$ |
| $40_{3,0}$ | $40_{2,2}$ |
| $40_{3,1}$ | $40_{2,3}$ |
| $40_{3,2}$ | $40_{2,0}$ |
| $40_{3,3}$ | $40_{2,1}$ |

An examination of logic 80 in data line control circuitry 48 shows that adjusting address signals R0–R3 and C0–C3 in the above-mentioned way so as to select one memory section 40 and assign another section 40 as the reference section for selected section 40 causes two of FETs 82 to be turned on. One of conducting FETs 82 connects the data input terminal of sense amplifier 50 through data input line 64 to a data line 62 connected through associated global bit line 60 to local bit line 58 in selected section 40. The other conducting FET 82 connects the reference input terminal of amplifier 50 through reference input line 66 to a data line 62 connected through associated global bit line 60 to local bit line 58 in reference section 40. Impedance matching at the input terminals of amplifier 50 is thereby achieved.

Figure 4:
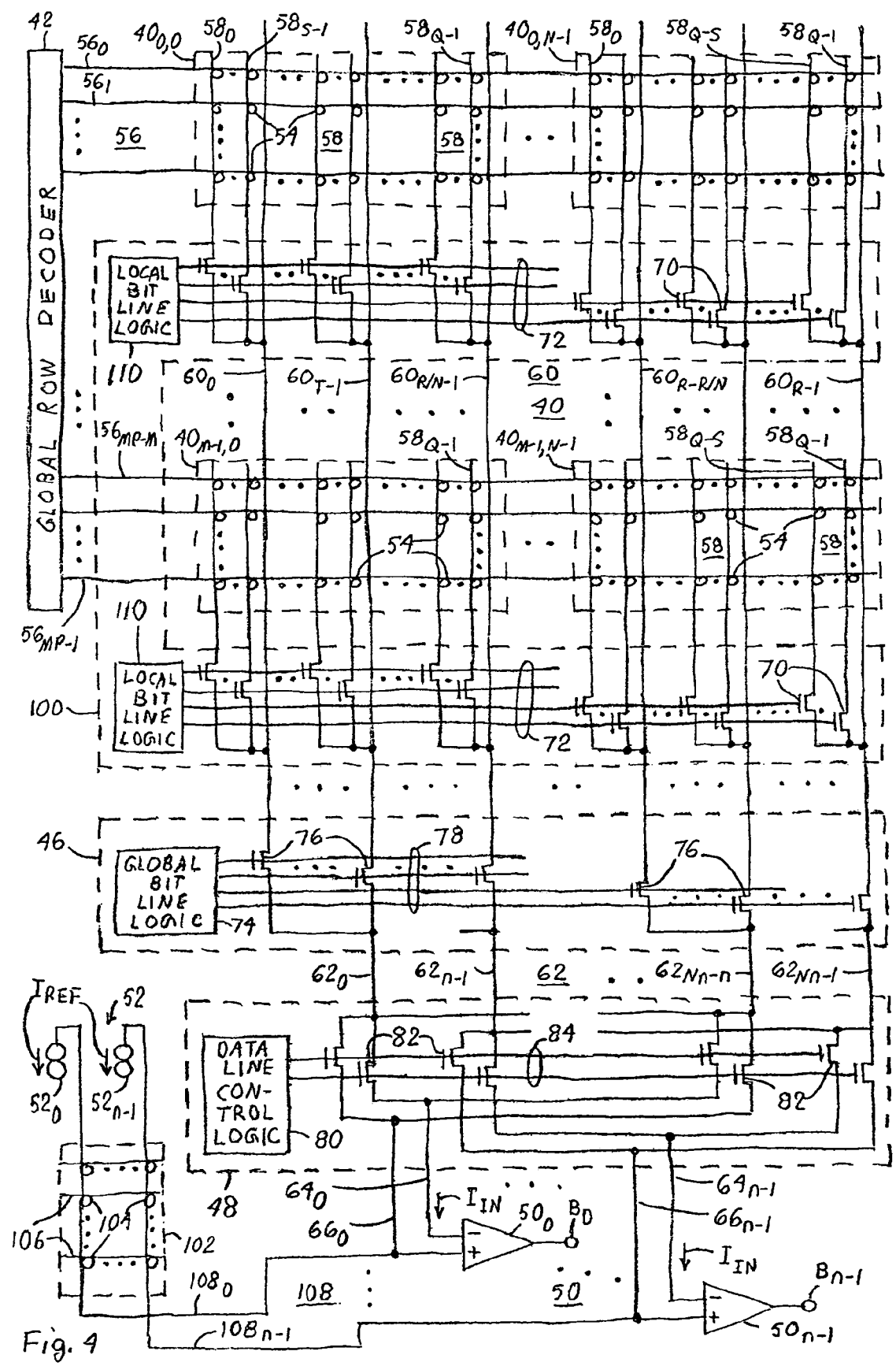
FIG. 4 is a block/circuit diagram of another memory having impedance-matched data sensing in accordance with invention.

FIG. 4 illustrates another memory configured according to the invention for achieving impedance-matched data sensing. The memory of FIG. 4 contains local memory sections 40, global row decoder 42, a local column decoder 100, global column decoder 46, data line control circuitry 48, n sense amplifiers 50, n reference current sources 52, and a reference local memory array 102. Local column decoder 100 in the memory of FIG. 4 is located in the same place as local column decoder 44 in the memory of FIG. 2. Although, decoder 100 functions differently than decoder 44, decoder 100 selectively connects local bit lines 50 to global bit lines 60 in response to suitable address signals just as decoder 44 does. Subject to this difference, components 40, 42, 46, 48, 50, and 52 in the memory of FIG. 4 are configured and operable the same as in the memory of FIG. 2.

Reference local memory array 102 contains a multiplicity of largely identical reference memory cells 104 functionally arranged in P cell rows and n cell columns. Reference memory cells 104 are largely identical to storage memory cells 54. Reference cells 104 are connected to P reference word lines 106 and n reference bit lines 108. Each cell 104 is specifically connected to one line 106 and one line 108 and, for illustration simplicity, is shown in FIG. 4 as being at the intersection of those two lines 106 and 108. Cells 104 are internally connected so as to be permanently non-conductive. Further information on memory array 102, including the internal connections of cells 104, is presented in FIG. 8 discussed below.

Reference bit lines 108 are numbered 108$_k$ in FIG. 4 where data bit number k runs from 0 to n−1. In addition to being electrically connected to P reference cells 104, each reference bit line 108 is connected between a corresponding different one of reference current sources 52 and the reference input terminal of corresponding sense amplifier 50. Reference bit lines 108 are basically local to reference array 102. Accordingly, array 102 can be divided into n reference memory sections 104/108, each of which contains a column of P reference cells 104 and one bit line 108 connected to those cells 104. Since each cell column in each memory section 40 contains P memory cells 54, each section 104/108 serves as a reference memory section for associated amplifier 50.

Local column decoder 100 contains local bit line logic 110 and local column switching FETs 70. Logic 110 differs from local bit line logic 68 in local column decoder 44 of the memory of FIG. 2. However, the combination of logic 110 and FETs 70 is interconnected between local bit lines 58 and global bit lines 60 in the memory of FIG. 4 in the same way that the combination of logic 68 and FETs 70 is interconnected between lines 58 and lines 60 in the memory of FIG. 2. In reading n of memory cells 54 along a selected word line 56 in a selected memory section 40, connection paths from the data input terminals of sense amplifiers 52 to those cells 54 go through the same circuit elements, including FETs 70, 76, and 82, in the memory of FIG. 4 as in the memory of FIG. 2. The data input terminal of each amplifier 52 sees an input impedance along a line having three basic segments: (a) a selected data line 62 connected to T FETs 76, (b) a selected global bit line 60 connected to NS FETs 70, and (c) a selected local bit line 58 connected to P cells 54.

The basic principle for achieving impedance-matched sensing in the memory of FIG. 4 is to connect the reference input terminal of each sense amplifier 50 to a pair of reference lines that together have largely the same impedance characteristics as a data line 62, a global bit line 60, and a local bit line 58. In particular, one of the reference lines has the same impedance characteristics as a local bit line 58. This reference line is implemented with one of reference bit lines 108. The other reference line, referred to as the global bit/data reference line, is implemented with a data line 62, referred to as reference data line 62, and a global bit line 60, referred to as reference global bit line 60, connected to reference data line 62 with all of FETs 70 connected to reference global bit line 60 turned off to avoid having the amplifier's input terminal see impedance from any of local bit lines 58 connected to those FETs 70.

As with local bit line logic 68 in the memory of FIG. 2, local bit line logic 110 in the memory of FIG. 4 provides control lines 72 with local column control signals that cause certain of FETs 70 to turn on and connect R/N local bit lines 58 in selected memory section 40 respectively to their global bit lines 60. Each of these so-connected global bit lines 60 is connected to one of the associated plurality of S local bit lines 58 so as to partially implement the column selection within selected memory section 40.

Likewise similar to what occurs in logic 68 in the memory of FIG. 2, the local column control signals provided by logic 110 in the memory of FIG. 4 normally cause certain further FETs 70 to turn on and simultaneously connect further local bit lines 58 in one or more memory sections 40 in the same section row as selected section 40 respectively to global bit lines 60 for those local bit lines 58. For instance, R/N predesignated local bit lines 58 are typically respectively connected to their global bit lines 60 in each of half of sections 40, including selected section 40, along the section row for selected section 40. Global bit line decoder 46 nulls any effect that these further connections might have on the data sensing.

Unlike what occurs in the memory of FIG. 2, the local column control signals provided by logic 110 in the memory of FIG. 4 cause all of FETs 70 for local bit lines 58 in memory sections 40 along every memory section row other than the section row for selected section 40 to be turned off when the local column control signals cause certain of FETs 70 to turn on in selected section 40. Consequently, none of global bit lines 60 is here connected to any of local bit lines 58 for any section 40 in a section row other than the section row for selected section 40. Taking note of the fact that logic 68 in the memory of FIG. 2 establishes a place for reference memory section 40 in a different section row than that for selected section 40, logic 110 in the memory of FIG. 4 does not establish such a place for reference section 40.

Global column decoder 46 operates the same in the memory of FIG. 4 as in the memory of FIG. 2 but achieves different connections because logic 110 provides different connections than logic 68. More particularly, decoder 46 in the memory of FIG. 4 performs a selection on global bit lines 60 to accomplish three functions: (a) connect certain global bit lines 60 that pass through selected memory section 40 to their data lines 62, (b) null the excess connections, if any, that logic 110 makes between local bit lines 58 and certain other global bit lines 60, and (c) establish the global bit/data reference lines for sense amplifiers 50 by connecting certain other data lines 62 to yet other global bit lines 60 connected to FETs 70 that are all turned off. Decoder 46 accomplishes the first two functions in the same way in the memory of FIG. 4 as in the memory of FIG. 2.

With respect to the third function, all of FETs 70 in the memory of FIG. 4 are turned off in at least one memory section column due to the operation of local bit line logic 110. Global bit line logic 74 in global column decoder 46 provides control lines 78 with global column control signals that cause certain of FETs 76 in one such memory section column to turn on and connect n of global bit lines 60 to their data lines 62. These connections provide the global bit/data reference lines for sense amplifiers 50. The control operations provided by column decoders 44 and 46 in combination with the selection of a local bit line 56 by row decoder 42 thus establishes which memory section 40 is selected for a read operation and which combinations of global bit lines 60 and data lines 62 form the global bit/data reference lines. Lines 60 and 62 of the global bit/data reference lines are the same lines that connect to reference section 40 in the memory of FIG. 2.

As mentioned above, data line control circuitry 48 operates the same in the memory of FIG. 4 as in the memory of FIG. 2. Hence, control circuitry 48 connects the n data input lines 64 extending from the data input terminals of sense amplifiers 50 respectively to n data lines 62 that are respectively connected through n selected global bit lines 60 to n selected local bit lines 58 of selected memory section 40. Since lines 60 and 62 of the global bit/data reference lines are lines that connect to reference memory section 40 in the memory of FIG. 2, control circuitry 48 in the memory of FIG. 4 also connects the n reference input lines 66 extending from the reference input terminals of amplifiers 50 respectively to the n global/data reference lines. Reference bit lines 108 are permanently connected to the reference input terminals of amplifiers 50. Consequently, the configuration needed for impedance matching in the memory of FIG. 4 is established.

Figure 5:
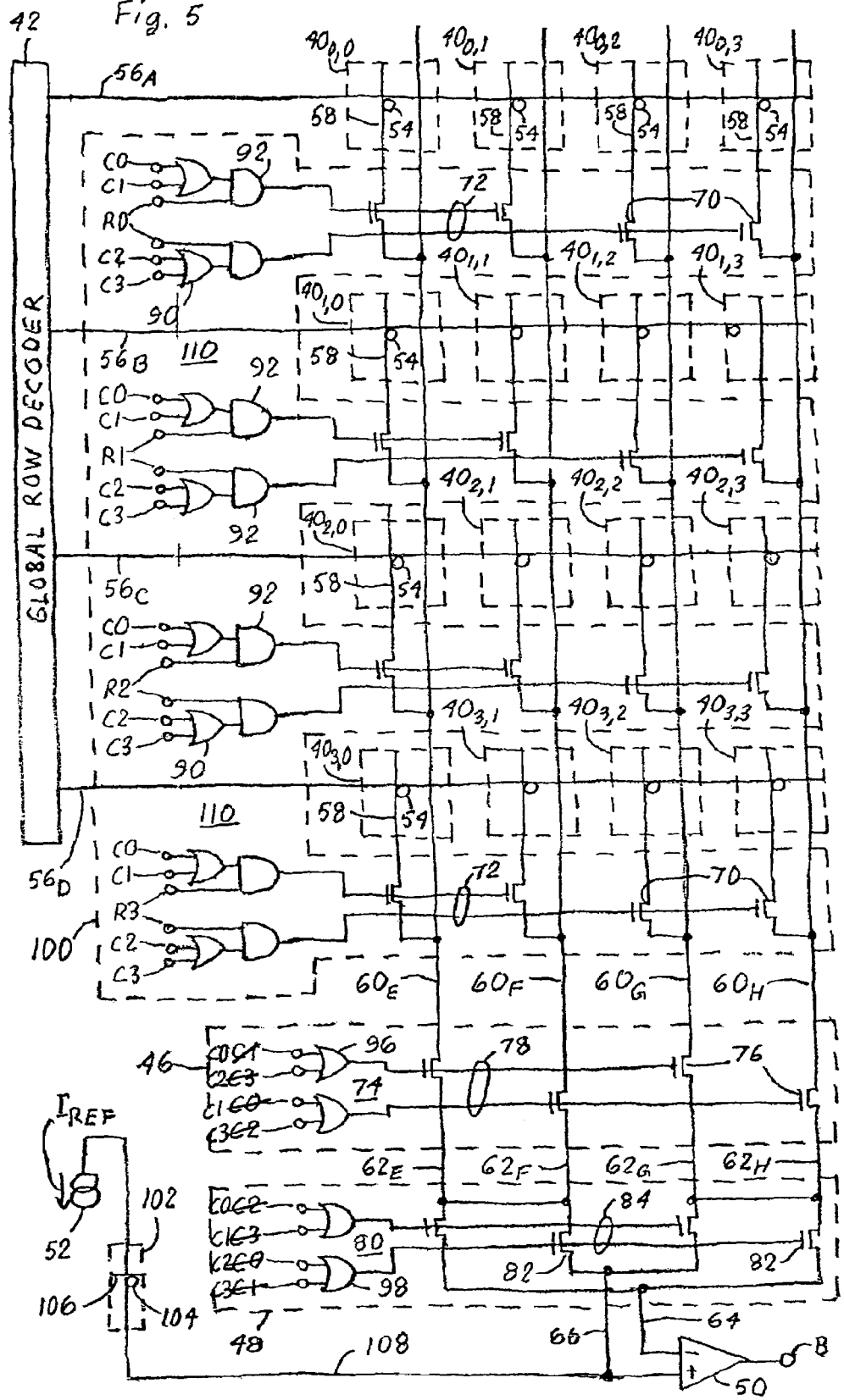
FIG. 5 is a block/circuit diagram of an implementation of part of the memory of FIG. 4.

A further understanding of the memory of FIG. 4 can be achieved by examining FIG. 5 which illustrates a partial implementation of the memory of FIG. 4. The embodiment of FIG. 5 implements the memory of FIG. 4 in the same way that the embodiment of FIG. 3 implements the memory of FIG. 2. Hence, the difference between FIGS. 3 and 5 is that (a) local column decoder 46 in the implementation of FIG. 3 is replaced with local column decoder 100 in the implementation of FIG. 5 and (b) reference current sources 52 are coupled through reference bit lines 108 and reference local memory array 102 to the reference input terminals of sense amplifiers 50. Local bit line logic 110 in local column decoder 100 in the implementation of FIG. 5 contains OR logic gates 90 and AND logic gates 92. OR logic gates 94 are absent in logic 110. All of the simplifications made in FIG. 3 are made in FIG. 5.

As with the implementation of FIG. 3, one local memory section 40, i.e., memory section 40 at the intersection of a particular memory section row and a particular memory section column, is selected for a read operation in the implementation of FIG. 5 by placing the row and column address signals for that section row and section column at logic "1" while placing the others of row address signals R0–R3 and column address signals C0–C3 at logic "0". An examination of logic 110 in decoder 100 of FIG. 5 shows that adjusting address signals R0–R3 and C0–C3 in this way causes two of FETs 70 to turn on. One of conducting FETs 70 provides a connection from one global bit line 60 to a local bit line 58 in memory section 40 intended to be selected. The other conducting FET 70 provides a connection from another global bit line 60 to a global bit line 58 of a memory section 40 in the same section row as selected section 40. Remaining FETs 70 are turned off.

An examination of global bit line logic 74 in global bit line decoder 46 of FIG. 5 shows, as in FIG. 3, that two of FETs 76 are turned on. One of conducting FETs 76 again provides a connection from one of data lines 62 to selected global bit line 60 connected to selected local bit line 58 in selected memory section 40. The other conducting FET 76 provides a connection from another data line 62 to a global bit line 60 connected to FETs 70 that are all turned off. This connection establishes the global bit/data reference line. Since the remaining two FETs 76 are turned off, the connection that logic 100 provides for the other section 40 in the same section row as selected section 40 is nulled.

An examination of data line control logic 80 in data line circuitry 48 of FIG. 5 shows, again as in FIG. 3, that two of FETs 82 are turned on. One of conducting FETs 82 connects the data input terminal of sense amplifier 50 through data input line 64 to data line 62 connected through selected global bit line 60 to selected local bit line 58 in selected memory section 40. The other conducting FET 82 connects the reference input terminal of sense amplifier 50 through reference input line 66 to lines 62 and 60 that form the global bit/data reference line. Since the amplifier's reference input terminal is already connected to reference bit line 108, impedance matching at the input terminals of amplifier 50 is achieved.

The array formed with local memory sections 40 in each of FIGS. 2–5 is typically implemented in a semiconductor integrated circuit as one of a group of such memory arrays. Eight of these memory arrays are typically provided in a memory integrated circuit. Only one set of n sense amplifiers 50 and n reference current sources 52 is typically provided in an integrated circuit. In the case of FIGS. 4 and 5, only one reference memory array 102 and one set of n reference bit lines 108 are likewise provided in such an integrated circuit. Suitable multiplexer circuitry is utilized to multiplex amplifiers 50 among the memory arrays.

The memories of FIGS. 2–5 are typically implemented as flash EPROMs. Each memory section 40 is then sometimes referred to as a sector or bank. The flash EPROM is provided with a capability for simultaneously erasing all memory cells 54 in any of sections 40. The erasure of each section 40 is performed separately, and thus can be done at a different time, than the erasure of any other section 40.

In one embodiment where the memory of FIG. 4 or 5 is implemented as a flash EPROM, the number n of sense amplifiers 50 (or bits in a word) is 16, the number M of memory section rows is 4, and the number N of memory section columns is 4. In each memory section 40, the number P of cell rows is 512, the number Q of cell columns is 1024, the number R of global bit lines 60 is 256, the number S of local bit lines 58 associated with a global bit line 60 is 4, and the number T of global bit lines 60 associated with a data line 62 is 16. The memory is also typically provided with redundant word and bit lines and associated memory cells that can be wired into the memory should any of components 54, 56, 58, 104, 106, and 108 be defective.

FIG. 6 depicts a split-gate floating-gate FET 120 suitable for implementing each memory cell 54 in producing the memory of any FIGS. 2–5 as a flash EPROM. Split-gate FET 120 has a source 122, a drain 124, a floating gate 126 overlying the FET's channel region near source 122, a control gate 128 overlying floating gate 126, and a select gate 130 overlying the channel region near drain 124. Select gate 130 and drain 124 are respectively connected to a word line 56 and a local bit line 58. Source 122 and control gate 128 are respectively connected to additional lines 132 and 134.

Appropriate voltages are variously placed on lines 56, 58, 132, and 134 for programming and erasing memory cell 54/split-gate FET 120 in FIG. 6. Programming entails introducing electrons onto floating gate 126 to raise the FET's threshold voltage. Erasing entails removing electrons from floating gate 126 to lower the threshold voltage.

The channel region of split-gate FET 120 is formed with the channel portion below floating gate 126 and the channel portion below select gate 130. The two channel portions are arranged in series. Both channel portions must be electrically conductive for FET 120 to be turned on. FET 120 is turned off when at least one of the channel portions is electrically non-conductive.

A control voltage is applied between control gate 128 and source 122 of split-gate FET 120 via lines 134 and 132. During read operations, the value of the control voltage lies between the high programmed value of the FET's threshold voltage and the low erased value of the threshold voltage. When FET 120 is in a programmed condition, the channel portion below floating gate 126 is thus non-conductive. Conversely, the channel portion below floating gate 126 is conductive when FET 120 is in an erased condition.

A selection voltage is applied between select gate 130 and source 122 via lines 56 and 132. If split-gate FET 120 is selected to be read, the selection voltage is sufficiently high to cause the channel portion below select gate 130 to be conductive. When FET 120 is in an erased condition, both channel portions are conductive so that FET 120 is turned on. A logic value, typically a logic "1", characteristic of a conductive transistor is read out of memory cell 54/FET 120.

When split-gate FET 120 is in a programmed condition, the channel portion below floating gate 126 remains non-conductive even though the channel portion below control gate 130 is conductive. As a result, FET 120 is turned off. A logic value, typically a logic "0", characteristic of a non-conductive transistor is read out of memory cell 54/FET 120. If FET 120 is not selected to be read, the selection voltage applied between select gate 130 and source 122 is sufficiently low that the channel portion below select gate 130 is non-conductive. Hence FET 120 is turned off when it is not selected.

If excess electrons are removed from floating gate 126 during an erasure operation, the channel portion below floating gate 126 may invert, i.e., go into a conducting condition, even though the selection voltage applied between select gate 130 and source 122 is not at a high reading value. However, the channel portion below select gate 130 will still be non-conductive. Inasmuch as a conductive path from source 122 to drain 124 through the channel region will not be present, FET 120 will remain off. Consequently, overerasure does not cause a problem in split-gate FET 120 of FIG. 6.

FIG. 7 illustrates circuitry suitable for implementing reference current sources 52. The illustrated circuitry includes a split-gate floating-gate FET 140, a pair of largely identical p-channel FETs 142A and 142B, an FET 144, and n FETs 146 that respectively implement reference sources 52. FETs 142A and 142B are arranged in a current-mirror configuration with their sources connected to a source of a high supply voltage $V_{DD}$.

P-channel FET 142A is drain-drain coupled to split-gate FET 140 whose source is connected to a source of a low supply voltage $V_{SS}$, typically ground reference. One or more FETs (not) shown may be drain-source inserted between the drains of FETs 140 and 142A for controlling current sources 52. Voltage signals $V_{SR}$ and $V_{CR}$ are respectively supplied to the select and control gates of FET 140. During read operations, signals $V_{SR}$ and $V_{CR}$ are both set at $V_{DD}$.

P-channel FET 142B is drain-drain connected to FET 144 whose source is connected to the $V_{SS}$ supply. Split-gate FET 140, which is substantially identical to split-gate FET 120 in FIG. 6, is in an erased condition and thus has a low threshold voltage. With signals $V_{SR}$ and $V_{CR}$ being at $V_{DD}$ at during read operations, FET 140 draws a current approximately equal to $2I_{REF}$. Because largely identical FETs 140A and 140B form a current mirror, a current approximately equal to $2I_{REF}$ also flows through FET 144 during read operations.

The sources of FETs 146 are connected to the $V_{SS}$ supply. Each FET 146 is arranged in a current-mirror configuration with FET 144. However, each FET 146 is of approximately half the channel width of FET 144. Each FET 146 thereby draws a current $I_{REF}$ so as to implement one of reference current sources 52.

Figure 8:
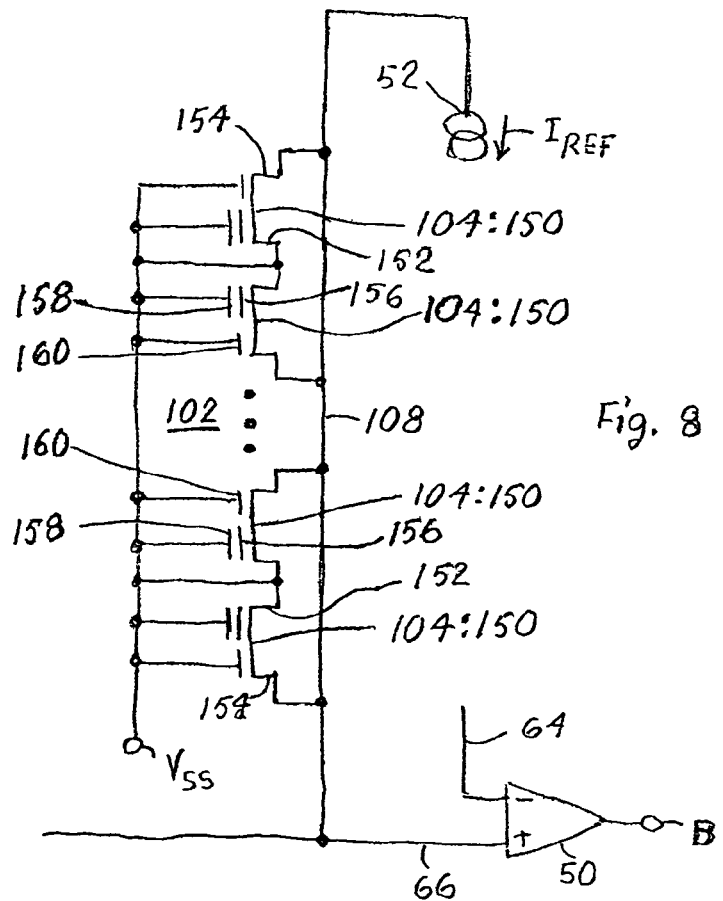
FIG. 8 is a block/circuit diagram of an implementation of the reference memory section employed in the memory of FIG. 4 or 5.

FIG. 8 depicts how reference local memory array 102 is typically implemented in the memory of FIG. 4 or 5 when memory cells 54 are formed with split-gate FETs 120 as shown in FIG. 6. Each reference memory cell 104 in array 102 of FIG. 8 consists of a split-gate floating-gate FET 150 substantially identical to each FET 120. Each split-gate FET 150 has a source 152, a drain 154, a floating gate 156, a control gate 158, and a select gate 160 arranged the same as elements 122, 124, 126, 128 and 130 in each FET 120. Drains 154 are connected to reference bit line 108. FETs 150 are maintained in an always-off condition by providing low supply voltage $V_{SS}$ to sources 152 and gates 158 and 160.

While the invention has been described with reference to particular embodiments, this description is solely for the purpose of illustration and is not to be construed as limiting the scope of the invention claimed below. For example, the principles of invention can be applied to volatile memories, such as random-access memories of the static or dynamic type. In addition to EPROMs, the principles of the invention can also be applied to other non-volatile memories such as read-only memories and programmable read-only memories.

Each of memory cells 54 and 104 can be implemented with a split-gate floating-gate FET in which the select and control gates are merged together to form a composite control gate. Cells 54 and 104 can also be implemented with stacked-gate floating-gate FETs. Various modifications and applications may thus be made by those skilled in the art without departing from the true scope of the invention as defined in the appended claims.

I claim:

1. A memory comprising:
   a group of memory sections functionally arranged in section rows and section columns, each memory section comprising (a) a multiplicity of storage memory cells functionally arranged in cell rows and cell columns and (b) multiple local bit lines each electrically connected to the memory cells in a different one of the cell columns;
   multiple global bit lines allocated into global bit line sets respectively corresponding to the section columns, each global bit line in each global bit line set associated with a different plurality of the local bit lines in each of the memory sections of the corresponding section column;
   multiple data lines respectively corresponding to the section columns, each data line associated with the global bit lines for the corresponding section column;
   a sense amplifier having a data input terminal, a reference input terminal, and an output terminal for providing an output signal indicative of a comparison between signals at the input terminals;
   a reference current source for providing the reference input terminal with a reference current; and
   selection/connection circuitry for selecting each local bit line, the selection/connection circuitry being operable to electrically connect each selected local bit line in each memory section of each of the section rows and section columns to the data input terminal by way of (a1) the global bit line for the selected local bit line and (a2) the data line for that global bit line and to largely simultaneously electrically connect a reference one of the local bit lines in a reference one of the memory sections in another of the section rows and in another of the section columns to the reference input terminal by way of (b1) the global bit line, termed the reference global bit line, for the reference local bit line and (b2) the data line for the reference global bit line, none of the memory cells along the local bit lines associated with the reference global bit line then being selected whereby the sense amplifier reads a selected one of the memory cells along the selected local bit line.

2. A memory as in claim 1 wherein the selection/connection circuitry comprises:
   a local column decoder for selectively electrically connecting each global bit line to each local bit line in each of the associated pluralities of local bit lines; and a global column decoder for selectively electrically connecting each data line to each of the associated global bit lines.

3. A memory as in claim 2 wherein the selection/connection circuitry includes data line control circuitry for selectively electrically connecting each data line to each input terminal.

4. A memory as in claim 3 wherein the selection/connection circuitry includes signal providing circuitry for providing the decoders and data line control circuitry with input signals that selectively cause each local bit line to be electrically connected to the data input terminal by way of that local bit line's global bit line and that global bit line's data line and that largely simultaneously cause the reference local bit line to be electrically connected to the reference input terminal by way of the reference global bit line and the reference global bit line's data line.

5. A memory as in claim 1 wherein each cell column has the same number of memory cells as each other cell column.

6. A memory as in claim 1 wherein each memory cell comprises a split-gate floating-gate insulated-gate field-effect transistor.

7. A memory as in claim 1 wherein the reference current is approximately half that flowing through each memory cell when it is fully conductive.

8. A memory as in claim 1 wherein the sense amplifier compares currents at the input terminals.

9. A memory as in claim 1 wherein the memory cells in each memory section are erased substantially simultaneously and separately from the memory cells in each other memory section.

10. A memory comprising:
a group of memory sections functionally arranged in section rows and section columns, each memory section comprising (a) a multiplicity of storage memory cells functionally arranged in cell rows and cell columns and (b) multiple local bit lines each electrically connected to the memory cells in a different one of the cell columns;
multiple global bit lines allocated into global bit line sets respectively corresponding to the section columns, each global bit line in each global bit line set associated with a different plurality of the local bit lines in each of the memory sections of the corresponding section column;
n data line groups each comprising multiple data lines respectively corresponding to the section columns where n is a plural integer, one of the data lines in each data line group thereby corresponding to each section column, each data line associated with a different plurality of the global bit lines for the corresponding section column;
n sense amplifiers respectively corresponding to the data line groups, each sense amplifier having a data input terminal, a reference input terminal, and an output terminal for providing an output signal indicative of a comparison between signals at the input terminals;
reference current-source circuitry for providing the reference input terminals respectively with n reference currents; and
selection/connection circuitry for handling the local bit lines in sets of n local bit lines of each memory section where each local bit line in each such set of n local bit lines is associated, through the associated global bit line, with a different corresponding one of the data lines and, through the associated data line, with a different corresponding one of the sense amplifiers, the selection/connection circuitry being operable to select each set of n local bit lines and to electrically connect the local bit lines in each selected set in each memory section of each of the section rows and section columns respectively to the data input terminals of the corresponding sense amplifiers by way of (a1) the respective global bit lines for the n selected local bit lines and (a2) the respective data lines for those global bit lines and to largely simultaneously electrically connect a set of n reference ones of the local bit lines in a reference one of the memory sections in another of the section rows and in another of the section columns respectively to the reference input terminals of the corresponding sense amplifiers by way of (b1) the respective global bit lines, termed the reference global bit lines, for the reference local bit lines and (b2) the respective data lines for the reference global bit lines, none of the memory cells along the local bit lines associated with the reference global bit lines then being selected whereby the sense amplifiers read selected ones of the memory cells along the selected local bit lines.

11. A memory as in claim 10 wherein each memory cell comprises a split-gate floating-gate insulated-gate field-effect transistor.

12. A memory as in claim 10 wherein the selection/connection circuitry comprises:
a local column decoder for selectively electrically connecting each global bit line to each local bit line in each of the associated pluralities of local bit lines; and
a global column decoder for selectively electrically connecting each data line to each of the associated global bit lines.

13. A memory as in claim 12 wherein the selection/connection circuitry includes data line control circuitry for selectively electrically connecting each data line of each data line group to each input terminal of the corresponding sense amplifier.

14. A memory as in claim 10 wherein each reference current is approximately half that flowing through each memory cell when it is fully conductive.

15. A memory as in claim 10 wherein each sense amplifier compares currents at its input terminals.

16. A memory as in claim 10 wherein the memory cells in each memory section are erased substantially simultaneously and separately from the memory cells in each other memory section.

17. A memory comprising:
a group of memory sections functionally arranged in section rows and sections columns, each memory section comprising (a) a multiplicity of storage memory cells functionally arranged in cell rows and cell columns and (b) multiple local bit lines each electrically connected to the memory cells in a different one of the cell columns;
multiple global bit lines allocated into global bit line sets respectively corresponding to the section columns, each global bit line in each global bit line set associated with a different plurality of the local bit lines in each of the memory sections of the corresponding section column;
multiple data lines respectively corresponding to the section columns, each data line associated with the global bit lines for the corresponding section column;
a sense amplifier having a data input terminal, a reference input terminal, and an output terminal for providing an output signal indicative of a comparison between signals at the input terminals;

a reference current source for providing the reference input terminal with a reference current;

a reference memory section comprising (a) a column of reference memory cells and (b) a reference bit line connected to the reference memory cells and to the reference input terminal; and selection/connection circuitry for selecting each local bit line, the selection/connection circuitry being operable to electrically connect each selected local bit line in each memory section of each of the section columns to the data input terminal by way of (a1) the global bit line for the selected bit line and (a2) the data line for that global bit line and to largely simultaneously electrically connect a reference one of the global bit lines for another of the section columns to the reference input terminal by way of the data line for the reference global bit line, none of the memory cells along the local bit lines associated with the reference global bit line then being selected whereby the sense amplifier reads a selected one of the memory cells along the selected local bit line.

18. A memory as in claim 17 wherein the selection/connection circuitry comprises:

a local column decoder for selectively electrically connecting each global bit line to each local bit line in each of the associated pluralities of local bit lines; and a global column decoder for selectively electrically connecting each data line to each of the associated global bit lines.

19. A memory as in claim 18 wherein the selection/connection circuitry includes data line control circuitry for selectively electrically connecting each data line to each input terminal.

20. A memory as in claim 19 wherein the selection/connection circuitry includes signal providing circuitry for providing the decoders and data line control circuitry with input signals that selectively cause each local bit line to be electrically connected to the data input terminal by way of that local bit line's global bit line and that global bit line's data line and that largely simultaneously cause the reference global bit line to be electrically connected to the reference input terminal by way of the reference global bit line's data line.

21. A memory as in claim 17 wherein the reference memory cells are non-conductive.

22. A memory as in claim 17 wherein each cell column has the same number of memory cells as each other cell column.

23. A memory as in claim 22 wherein the number of reference memory cells is the same as the number of storage memory cells in each cell column.

24. A memory as in claim 17 wherein each memory cell comprises a split-gate floating-gate insulated-gate field effect transistor.

25. A memory as in claim 17 wherein the reference current is approximately half that flowing through each storage memory cell when it is fully conductive.

26. A memory as in claim 17 wherein the sense amplifier compares currents at the input terminals.

27. A memory as in claim 17 wherein the reference bit line is electrically coupled between the reference input terminal and where the reference current source provides the reference current.

28. A memory as in claim 17 wherein the memory cells in each memory section are erased substantially simultaneously and separately from the memory cells in each other memory section.

29. A memory comprising:

a group of memory sections functionally arranged in section rows and section columns, each memory section comprising (a) a multiplicity of storage memory cells functionally arranged in cell rows and cell columns and (b) multiple local bit lines each electrically connected to the memory cells in a different one of the cell columns;

multiple global bit lines allocated into global bit line sets respectively corresponding to the section columns, each global bit line in each global bit line set associated with a different plurality of the local bit lines in each of the memory sections of the corresponding section column;

n data line groups each comprising multiple data lines respectively corresponding to the section columns where n is a plural integer, one of the data lines in each data line group thereby corresponding to each section column, each data line associated with a different plurality of the global bit lines for the corresponding section column;

n sense amplifiers respectively corresponding to the data line groups, each sense amplifier having a data input terminal, a reference input terminal, and an output terminal for providing an output signal indicative of a comparison between signals at the input terminals;

reference current-source circuitry for providing the reference input terminals respectively with n reference currents;

a reference memory array comprising n reference memory sections respectively corresponding to the sense amplifiers, each reference memory section comprising (a) a column of reference memory cells and (b) a reference bit line connected to the reference memory cells and to the reference input terminal of the corresponding sense amplifier; and selection/connection circuitry for handling the local bit lines in sets of n local bit lines of each memory section where each local bit line in each such set of n local bit lines is associated, through the associated global bit line, with a different corresponding one of the data lines and, through the associated data line, with a different corresponding one of the sense amplifiers, the selection/connection circuitry being operable to select each set of n local bit lines and to electrically connect the local bit lines in each selected set in each memory section of each of the section columns respectively to the data input terminals of the corresponding sense amplifiers by way of (a1) the respective global bit lines for the n selected local bit lines and (a2) the respective data lines for those global bit lines and to largely simultaneously electrically connect a set of n reference ones of the global bit lines for another of the section columns to the respective reference input terminals of the respective corresponding sense amplifiers by way of the respective data lines for those reference global bit lines, none of the memory cells along the local bit lines associated with the reference global bit lines then being selected whereby the sense amplifiers read selected ones of the memory cells along the selected local bit lines.

30. A memory as in claim 29 wherein the selection/connection circuitry comprises:

a local column decoder for selectively electrically connecting each global bit line to each local bit line in each of the associated pluralities of local bit lines; and a global column decoder for selectively electrically connecting each data line to each of the associated global bit lines.

31. A memory as in claim 30 wherein the selection/connection circuitry includes data line control circuitry for selectively electrically connecting each data line of each data line group to each input terminal of the corresponding sense amplifier.

32. A memory as in claim 29 wherein each memory cell comprises a split-gate floating-gate insulated-gate field-effect transistor.

33. A memory as in claim 29 wherein the reference bit line of each reference memory section is coupled between the reference input terminal of the corresponding sense amplifier and where the reference current-source circuitry provides the reference current for that sense amplifier.

34. A memory as in claim 29 wherein each reference current is approximately half that flowing through each memory cell when it is fully conductive.

35. A memory as in claim 29 wherein each sense amplifier compares currents at its input terminals.

36. A memory as in claim 29 wherein the memory cells in each memory section are erased substantially simultaneously and separately from the memory cells in each other memory section.

37. A method comprising:
providing a memory in which a group of memory sections are functionally arranged in section rows and section columns, each memory section contains (a) a multiplicity of storage memory cells functionally arranged in cell rows and cell columns and (b) multiple local bit lines each electrically connected to the memory cells in a different one of the cell columns, multiple global bit lines are allocated into global bit line sets respectively corresponding to the section columns, each global bit line in each global bit line set is associated with a different plurality of the local bit lines in each of the memory sections of the corresponding section column, multiple data lines respectively correspond to the section columns, each data line is associated with the global bit lines for the corresponding section column, and a sense amplifier has a data input terminal, a reference input terminal for receiving a reference current, and an output terminal for providing an output signal indicative of a comparison between signals at the input terminals;
selecting one of the local bit lines;
electrically connecting the selected local bit line to the data input terminal by way of (a1) the global bit line for the selected local bit line and (a2) the data line for that global bit line, the selected local bit line being in a selected one of the memory sections of one of the section rows and one of the section columns; and
largely simultaneously electrically connecting a reference one of the local bit lines in a reference one of the memory sections in another of the section rows and in another of the section columns to the reference input terminal by way of (b1) the global bit line, termed the reference global bit line, for the reference local bit line and (b2) the data line for the reference global bit line where none of the memory cells along the local bit lines associated with the reference global bit line is then selected thereby enabling the sense amplifier to read a selected one of the memory cells along the selected local bit line.

38. A method as in claim 37 further including erasing the memory cells in each memory section substantially simultaneously and separately from the memory cells in each other memory section.

39. A method as in claim 37 wherein the providing act includes providing each memory cell to comprise a split-gate floating-gate insulated-gate field-effect transistor.

40. A method comprising:
providing a memory in which a group of memory sections are functionally arranged in section rows and sections columns, each memory section contains (a) a multiplicity of storage memory cells functionally arranged in cell rows and cell columns and (b) multiple local bit lines each electrically connected to the memory cells in a different one of the cell columns, multiple global bit lines are allocated into global bit line sets respectively corresponding to the section columns, each global bit line in each global bit line set is associated with a different plurality of the local bit lines in each of the memory sections of the corresponding section column, multiple data lines respectively correspond to the section columns, each data line is associated with the global bit lines for the corresponding section column, and a sense amplifier has a data input terminal, a reference input terminal for receiving a reference current, and an output terminal for providing an output signal indicative of a comparison between signals at the input terminals;
providing a reference memory section comprising (a) a column of reference memory cells and (b) a reference bit line connected to the reference memory cells and to the reference input terminal;
selecting one of the local bit lines;
electrically connecting the selected local bit line to the data input terminal by way of (a1) the global bit line for the selected local bit line and (a2) the data line for that global bit line, the selected local bit line being in a selected one of the memory sections of one of the section columns; and
largely simultaneously electrically connecting a reference one of the global bit lines for another of the section columns to the reference input terminal by way of the data line for the reference global bit line where none of the memory cells along the local bit lines associated with the reference global bit line is then selected thereby enabling the sense amplifier to read a selected one of the memory cells along the selected local bit line.

41. A method as in claim 40 further including erasing the memory cells in each memory section substantially simultaneously and separately from the memory cells in each other memory section.

42. A method as in claim 40 wherein the memory-providing act includes providing each memory cell to comprise a split-gate floating-gate field-effect transistor.

43. A method comprising:
providing a memory in which a group of memory sections are functionally arranged in section rows and section columns, each memory section contains (a) a multiplicity of storage memory cells functionally arranged in cell rows and cell columns and (b) multiple local bit lines each electrically connected to the memory cells in a different one of the cell columns, multiple global bit lines are allocated into global bit line sets respectively corresponding to the section columns, each global bit line in each global bit line set is associated with a different plurality of the local bit lines in each of the memory sections of the corresponding section column, each of n data line groups comprises multiple data lines respectively corresponding to the section columns such that one of the data lines in each data line group corresponds to each section column where n is a plural integer, each data line is associated with the global bit lines for the corresponding section column, n sense amplifiers respectively correspond to the data line groups, and each sense amplifier has a data input terminal, a reference input terminal for receiving a reference current, and an output terminal for providing an output signal indicative of a comparison between signals at the input terminals;

handling the local bit lines in sets of n local bit lines of each memory section where each local bit line in each such set of n local bit lines is associated, through the associated global bit line, with a different corresponding one of the data lines and, through the associated data line, with a different corresponding one of the sense amplifiers;

selecting one of the sets of n local bit lines;

electrically connecting the local bit lines in the selected set respectively to the data input terminals of the corresponding sense amplifiers by way of (a1) the respective global bit lines for the local bit lines in the selected set and (a2) the respective data lines for those global bit lines, the selected set of local bit lines being in a selected one of the memory sections of one of the section rows and one of the section columns; and largely simultaneously electrically connecting a set of n reference ones of the local bit lines in a reference one of the memory sections in another of the section rows and in another of the section columns to the reference input terminals of the corresponding sense amplifiers by way of (b1) the respective global bit lines, termed the reference global bit lines, for the reference local bit lines and (b2) the respective data lines for the reference global bit lines where none of the memory cells along the local bit lines associated with the reference global bit lines is then selected thereby enabling the sense amplifiers to read selected ones of the memory cells along the local bit lines of the selected set.

44. A method as in claim 43 further including erasing the memory cells in each memory section substantially simultaneously and separately from the memory cells in each other memory section.

45. A method as in claim 43 wherein the providing act includes providing each memory cell to comprise a split-gate floating-gate insulated-gate field-effect transistor.

46. A method comprising:

providing a memory in which a group of memory sections are functionally arranged in section rows and section columns, each memory section contains (a) a multiplicity of storage memory cells functionally arranged in cell rows and cell columns and (b) multiple local bit lines each electrically connected to the memory cells in a different one of the cell columns, multiple global bit lines are allocated into global bit line sets respectively corresponding to the section columns, each global bit line in each global bit line set is associated with a different plurality of the local bit lines in each of the memory sections of the corresponding section column, each of n data line groups comprises multiple data lines respectively corresponding to the section columns such that one of the data lines in each data line group corresponds to each section column where n is a plural integer, each data line is associated with the global bit lines for the corresponding section column, n sense amplifiers respectively correspond to the data line groups, and each sense amplifier has a data input terminal, a reference input terminal for receiving a reference current, and an output terminal for providing an output signal indicative of a comparison between signals at the input terminals;

providing a reference memory array comprising n reference memory sections respectively corresponding to the sense amplifiers, each reference memory section comprising (a) a column of reference memory cells and (b) a reference bit line connected to the reference memory cells and to the reference input terminal of the corresponding sense amplifier;

handling the local bit lines in sets of n local bit lines of each memory section where each local bit line in each such set of n local bit lines is associated, through the associated global bit line, with a different corresponding one of the data lines and, through the associated data line, with a different corresponding one of the sense amplifiers;

selecting one of the sets of n local bit lines;

electrically connecting the local bit lines in the selected set respectively to the data input terminals of the corresponding sense amplifiers by way of (a1) the respective global bit lines for the local bit lines in the selected set and (a2) the respective data lines for those global bit lines, the selected set of local bit lines being in a selected one of the memory sections of one of the section columns; and largely simultaneously electrically connecting a set of n reference ones of the local bit lines in a reference one of the memory sections in another of the section columns to the reference input terminals of the corresponding sense amplifiers by way of (b1) the respective global bit lines, termed the reference global bit lines, for the reference local bit lines and (b2) the respective data lines for the reference global bit lines where none of the memory cells along the local bit lines associated with the reference global bit lines is then selected thereby enabling the sense amplifiers to read selected ones of the memory cells along the local bit lines of the selected set.

47. A method as in claim 46 further including erasing the memory cells in each memory section substantially simultaneously and separately from the memory cells in each other memory section.

48. A method as in claim 46 wherein the memory-providing act includes providing each memory cell to comprise a split-gate floating-gate insulated-gate field-effect transistor.

* * * * *